(12) United States Patent
Heo et al.

(10) Patent No.: US 7,449,402 B2
(45) Date of Patent: Nov. 11, 2008

(54) METHOD OF FABRICATING SEMICONDUCTOR DEVICE

(75) Inventors: Soo-bong Heo, Yongin-si (KR); Chel-jong Choi, Osan-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 333 days.

(21) Appl. No.: 11/336,802

(22) Filed: Jan. 23, 2006

(65) Prior Publication Data

US 2006/0166418 A1 Jul. 27, 2006

(30) Foreign Application Priority Data

Jan. 21, 2005 (KR) ............... 10-2005-0005835

(51) Int. Cl.
*H01L 21/336* (2006.01)

(52) U.S. Cl. ............... 438/585; 257/E21.176

(58) Field of Classification Search ......... 438/151–166, 438/585–595; 257/E21.176
See application file for complete search history.

(56) References Cited

U.S. PATENT DOCUMENTS 5,470,763 A * 11/1995 Hamada ............. 438/162

6,841,851 B2    1/2005 Jung
2002/0192914 A1* 12/2002 Kizilyalli et al. ........... 438/300

FOREIGN PATENT DOCUMENTS

JP          2002-075987 A     3/2002
KR          10-0195195 B1     2/1999

OTHER PUBLICATIONS

Official Action (Notice to Submit Response) issued by the Korean Intellectual Property Office in corresponding 1030681 Korean Patent Application No. 10-2005-0005835; Apr. 26, 2006; and English translation thereof.

* cited by examiner

*Primary Examiner*—Richard A. Booth
(74) *Attorney, Agent, or Firm*—Buchanan Ingersoll & Rooney PC

(57) ABSTRACT

Provided is a method of fabricating a semiconductor device, the method including: forming an insulating layer on a single crystal substrate; etching the insulating layer in a predetermined pattern to expose the surface of the single crystal substrate; depositing an amorphous material on the insulating layer and the exposed surface of the single crystal substrate; and completely melting the amorphous material on the single crystal substrate and the insulating layer using laser annealing and crystallizing the melted amorphous material. The semiconductor device has a single crystalline silicon gate on the insulating layer.

13 Claims, 5 Drawing Sheets

METHOD OF FABRICATING SEMICONDUCTOR DEVICE

CROSS-REFERENCE TO RELATED PATENT APPLICATIONS

Priority is claimed to Korean Patent Application No. 10-2005-0005835, filed on Jan. 21, 2005, in the Korean Intellectual Property Office, the disclosure of which is incorporated herein in its entirety by reference.

BACKGROUND OF THE DISCLOSURE

1. Field of the Disclosure

The present disclosure relates to a method of fabricating a semiconductor device, and more particularly, to a method of growing single crystal on a dielectric insulating layer.

2. Description of the Related Art

Polycrystalline Si (polysilicon) has a higher carrier mobility than amorphous Si (a-Si), and thus is widely used in semiconductor devices. U.S. Pat. No. 6,841,851 discloses a semiconductor device using doped polysilicon as a gate material.

In general, grain boundaries of polysilicon trap charges, and thus obstruct electron transportation. In addition, the interface between a polysilicon gate and a metal silicide layer on the polysilicon gate is rough, and thus a large current leakage occurs.

This drawback can be improved by a single crystalline Si gate. However, single crystalline Si cannot be directly grown on a nitride or oxide insulating layer. Polysilicon can be obtained by depositing and annealing a-Si at a high temperature, for example, using chemical vapor deposition (CVD) or plasma enhanced chemical vapor deposition (PECVD), and thus can be formed on any substrate regardless of a substrate material.

However, since polysilicon has physically inferior to single crystalline Si, research into single crystalline Si which can be formed regardless of substrate material is still required.

SUMMARY OF THE DISCLOSURE

The present disclosure provides a method of fabricating a semiconductor device having a single crystalline Si gate.

The present disclosure provides a method of fabricating a semiconductor device which has uniform electron transportation and low leakage current characteristics.

According to an aspect of the present invention, there is provided a method of fabricating a semiconductor device, the method comprising: forming an insulating layer on a single crystal substrate; etching the insulating layer in a predetermined pattern to expose the surface of the single crystal substrate; depositing an amorphous material on the insulating layer and the exposed surface of the single crystal substrate; and completely melting the amorphous material on the single crystal substrate and the insulating layer using laser annealing and crystallizing the melted amorphous material.

The single crystal substrate may be formed of one of Si, GaAs, GaN, SiC, and SiGe.

The insulating layer may be formed of at least one of Si-oxide (Si—O), Ga-oxide (Ga—O), Ge-oxide (Ge—O), SiGe-oxide (SiGe—O), and SiC-oxide (SiC—O).

The insulating layer may be formed by thermally oxidizing the surface of the single crystal substrate. The thermal oxidation may be performed in a furnace in a wet condition at a temperature of 700-1100° C. for about 1-100 minutes.

The depositing of the amorphous material may be performed using one of low-pressure chemical vapor deposition (LPCVD), sputtering, plasma enhanced chemical vapor deposition (PECVD), metal-organic chemical vapor deposition (MOCVD), electron-beam evaporation, and atom layer deposition (ALD). For example, the depositing of the amorphous material may be performed using low-pressure chemical vapor deposition (LPCVD) at a temperature of 350-750° C. for 1-100 minutes.

In the completely melting the amorphous material, the laser annealing may be performed at an energy density of 300-1200 mJ/cm$^2$. In the laser annealing, the number of laser shots may be in a range of 1-100 times. The laser annealing may be performed using excimer laser.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE DISCLOSURE

Hereinafter, embodiments of a method of fabricating a semiconductor device according to the present disclosure will be described with reference the accompanying drawings.

Figure 1:
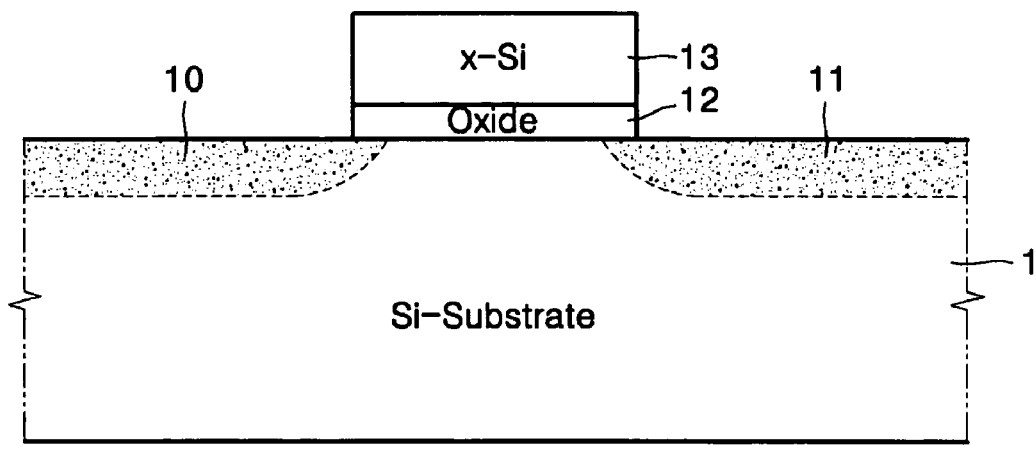
FIG. 1 is a schematic sectional view of parts of a semiconductor device having a single crystalline silicon gate fabricated according to an exemplary embodiment of the present invention.

FIG. 1 is a schematic sectional view of a semiconductor device having a single crystalline silicon gate according to an exemplary embodiment of the present disclosure.

Referring to FIG. 1, a source 10 and a drain 11 are disposed on a silicon substrate 1 by doping. A gate insulating layer 12 and a single crystalline Si gate 13 are sequentially disposed between the source 10 and the drain 11. The semiconductor device has the same in structure as a conventional semiconductor device including a polysilicon gate, but differs in the crystalline status of a gate from the conventional semiconductor device.

In the method according to the present disclosure, the single crystalline Si (x-Si) gate 13 is formed on the insulating layer 12 using a crystallization process. The single crystalline Si can be obtained through a featured crystallization process according to the present disclosure. Such a single crystalline structure can be according to the present disclosure. Such a single crystalline structure can be obtained from various semiconductor materials in addition to silicon. Examples of semiconductor materials for the single crystalline structure include Si, GaAs, GaN, SiC, and SiGe. Such single crystalline semiconductor materials are grown on substrates made of the same materials, for example, Si, GaAs, GaN, SiC, and SiGe. In an embodiment according to the present disclosure below, a method of forming a silicon crystalline silicon gate on an insulating layer formed on a Si wafer will be described. Single crystal gates using other materials can be easily formed based on the following description.

Figure 2A:
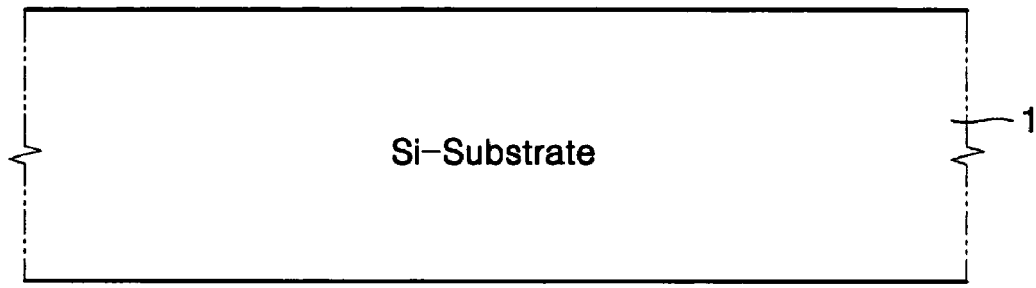
FIGS. 2A through 2G are sectional views for explaining a method of fabricating a semiconductor device having a single crystalline silicon gate according to an exemplary embodiment of the present invention.

Referring to FIG. 2A, a silicon wafer or a silicon substrate 1 is prepared.

Figure 2B:
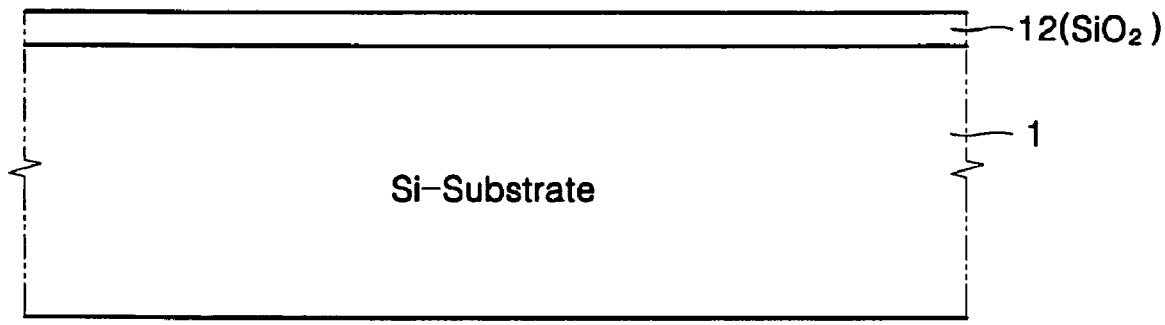

Referring to FIG. 2B, a silicon oxide ($SiO_2$) layer as an insulating layer 12 is formed on the substrate 1 as the insulating layer 12 by thermal oxidation. Before the silicon oxide layer is formed, a natural oxide layer existing on the silicon wafer is removed using a solution containing hydrofluoric acid (HF). The thermal oxidation is performed in a furnace in a wet condition at 875° C. for about 10 minutes.

Figure 2C:
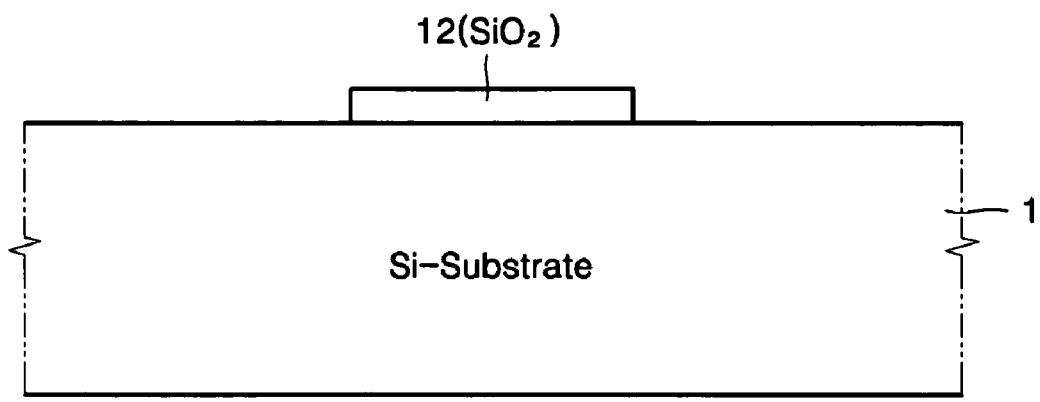

Referring to FIG. 2C, the insulating layer 12 is patterned using photolithography. The insulating layer 12 can be, for example, a gate insulating layer of the semiconductor device and thus, is patterned according to the design of the gate insulating layer. The patterning is performed using a common wet-etching method. However, a dry-etching method can be used. As a result of the patterning, the insulating layer 12 is partially removed, thereby exposing portions of the surface of the silicon substrate 1 on both sides of the insulating layer 12.

Figure 2D:
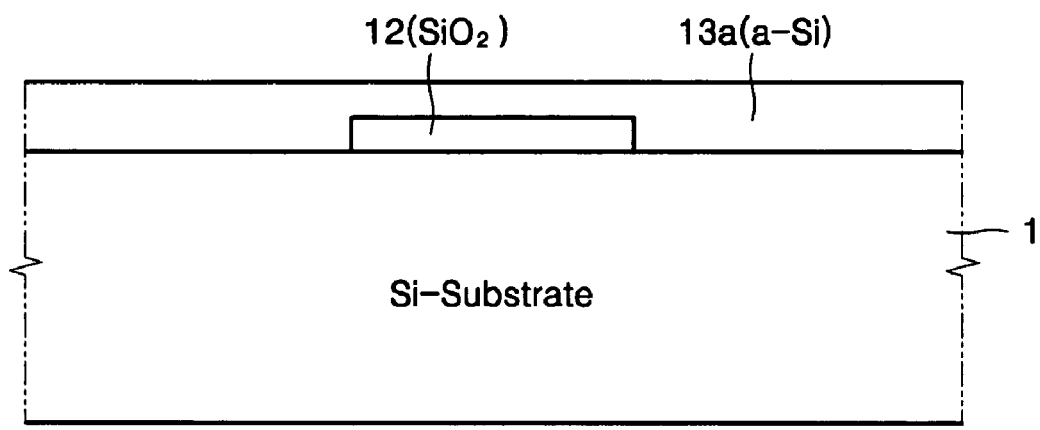

Referring to FIG. 2D, an amorphous silicon (a-Si) layer 13a is deposited on the insulating layer 12 and the silicon substrate 1. The a-Si layer 13a can be deposited using various well-known deposition methods, such as low-pressure chemical vapor deposition (LPCVD), sputtering, PECVD, metal-organic chemical vapor deposition (MOCVD), electron-beam evaporation, atom layer deposition (ALD), etc. For example, the a-Si layer 13a may be deposited using LPCVD at 560° C. for 60 minutes. When depositing the a-Si layer 13a, a Group II or V element of the periodic table may be added as a dopant.

Figure 2E:
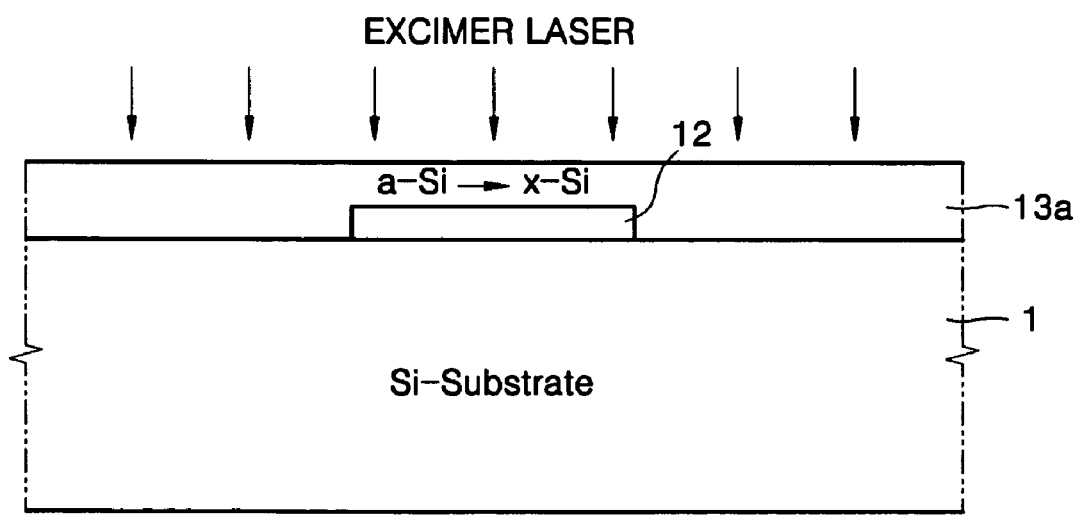

Referring to FIG. 2E, the a-Si layer 13a is crystallized using laser annealing. In the crystallization process, the surface of the silicon substrate 1 which the a-Si 13a contacts acts as seeds for crystallization. In a general annealing condition, the energy which is sufficiently high to melt the a-Si 13a layer is required. A general should be sufficiently high to fully melt the deposited a-Si layer 13a. In the present embodiment, since the thickness of the a-Si layer 13a is 200 nm, the energy density is about 300-1200 $mJ/cm^2$, for example, about 900 $mJ/cm^2$, and the number of laser shots is 1-100 times.

Figure 2F:
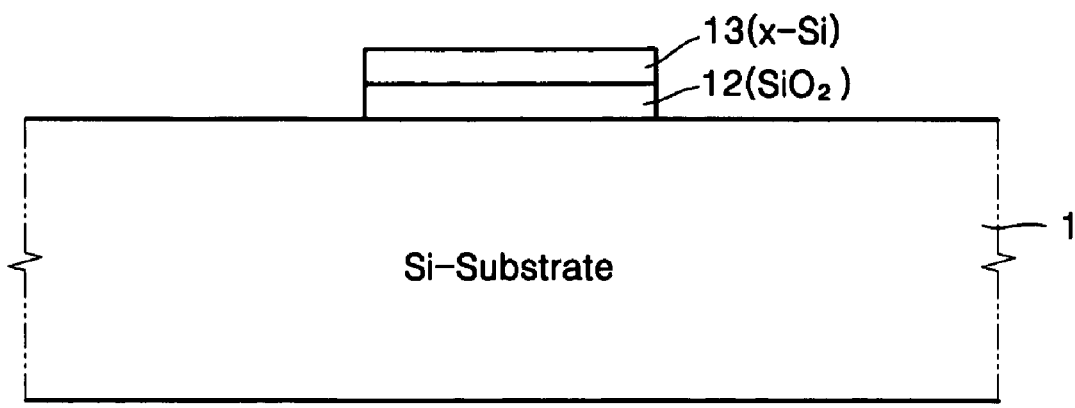

Referring to FIG. 2F, a single crystal layer obtained by crystallizing the a-Si layer13a is patterned to obtain a single crystalline silicon (x-Si) gate 13. This patterning process is performed using widely known photolithography.

Post-semiconductor processes are performed on the structure in FIG. 2F to obtain a desired semiconductor device. The post-processes include depositing metal such as Co, Ni, Ti, etc. to form a contact layer, forming a metal silicide layer by annealing the metal layer, depositing an interlayer dielectric (ILD) layer, forming a contact hole in the ILD layer, and depositing and patterning a metal layer to form a source electrode, a gate electrode, and a drain electrode.

Figure 2G:
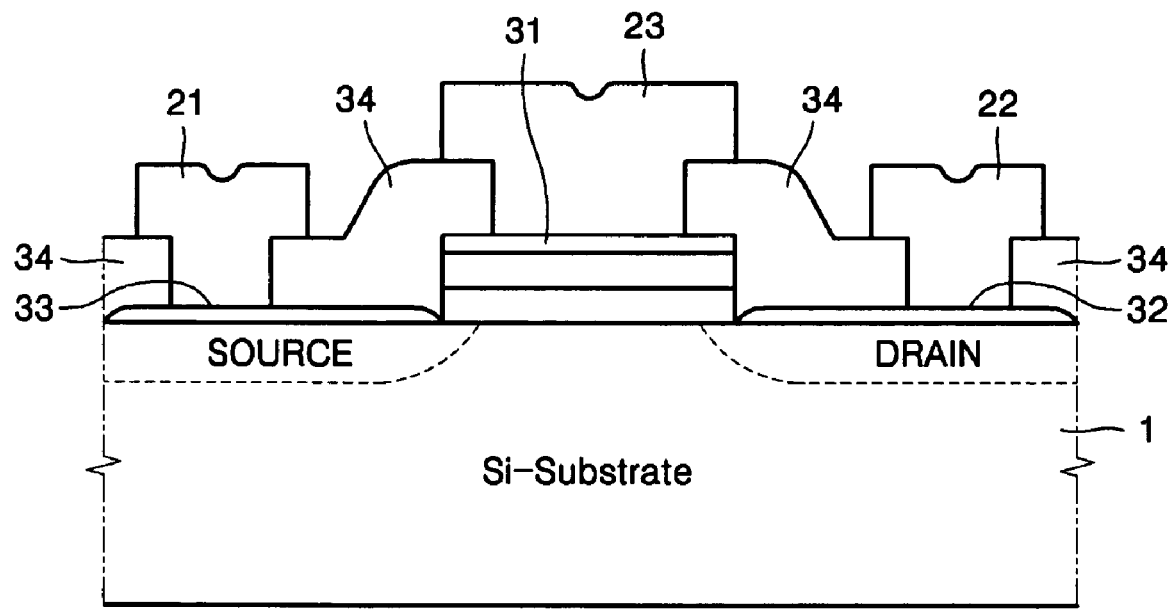

Referring to FIG. 2G, metal silicide layers 31, 32, and 33 are respectively formed as contact layers on x-Si gate 13 and a source and a drain formed by doping. A source electrode 21, a gate electrode 23, and a drain electrode 22 are formed on an interlayer metal dielectric (IMD) layer 34 and are respectively electrically connected to the underlying source, the x-Si gate 13, and the drain through contact holes formed in the IMD layer 34.

The structure of the semiconductor device in FIG. 2G is an example of various types of devices which can be obtained according to the fabrication method according to the present disclosure.

Figure 3:
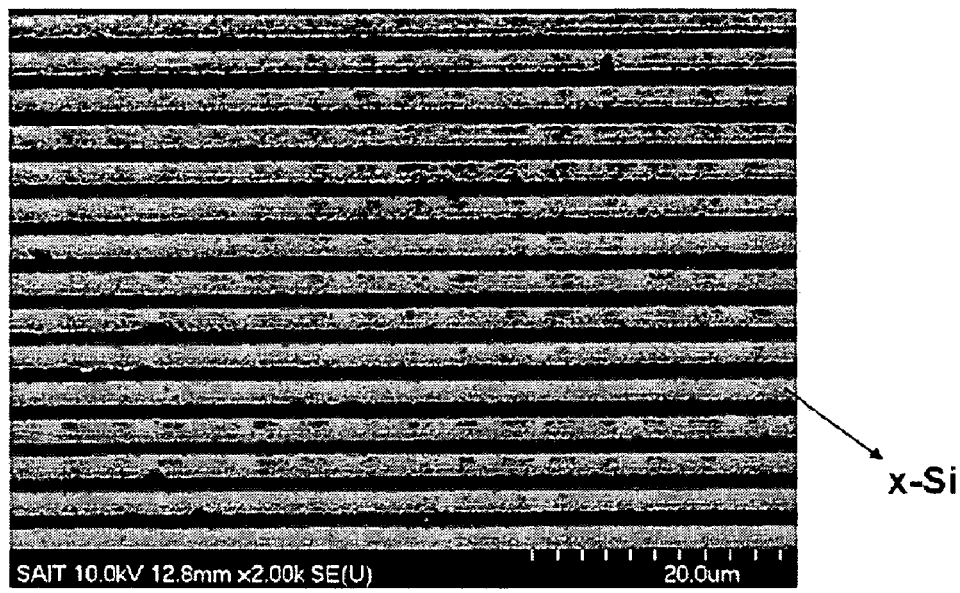
FIG. 3 is a scanning electron microscope (SEM) image of a single crystalline silicon gate fabricated using the method according to an exemplary embodiment of the present invention.
Figure 4:
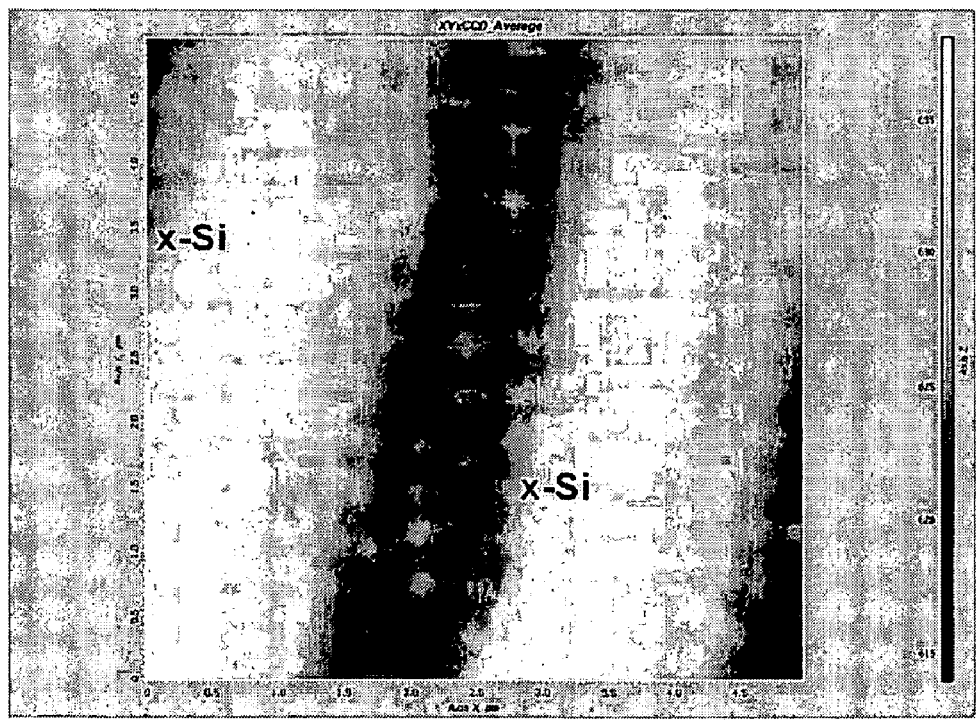
FIG. 4 is a Raman image of the single crystalline Si gate in FIG. 3.

FIG. 3 is a scanning electron microscope (SEM) image of a x-Si gate obtained using the method according to the present disclosure. In FIG. 3, brighter stripe regions corresponding to x-Si regions, and darker regions are the surface of the silicon substrate. The x-Si gate in FIG. 3 was obtained through laser annealing at an energy density of about 900 $mJ/cm^2$. FIG. 4 is an enlarged Raman image of the x-Si gate in FIG. 3. A larger region in FIG. 4 corresponds to the surface of the Si substrate.

Figure 5:
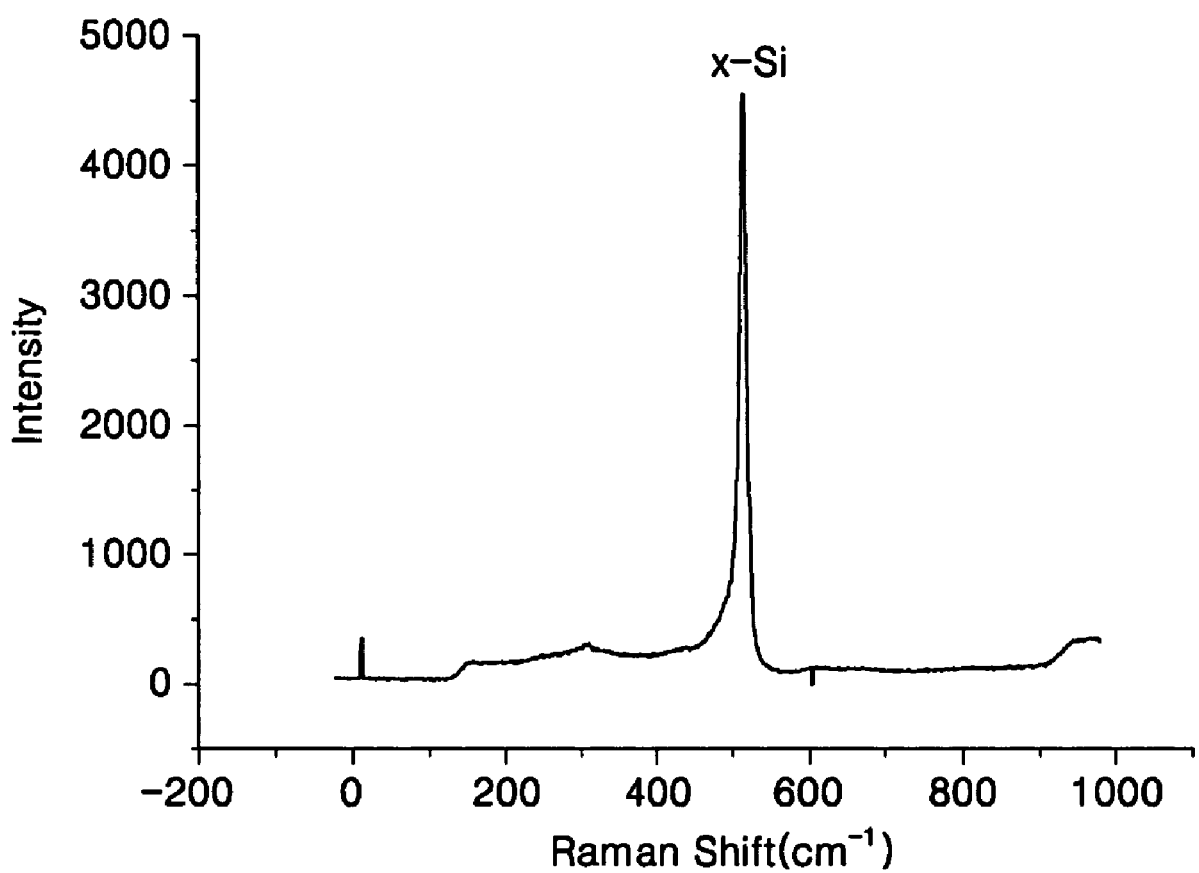
FIG. 5 is a Raman spectrum of single crystalline Si fabricated according to an exemplary embodiment of the present invention.

FIG. 5 is a Raman spectrum of the x-Si annealed at an energy of 900 $mJ/cm^2$. Referring to FIG. 5, a single x-Si peak appears near a Raman shift of 500 $cm^{-1}$.

As described above, in a method of fabricating a semiconductor device according to the present disclosure, a single crystal material layer composed of, for example, Si, GaAs, SiGe, GaN, SiC, etc., can be formed on an insulating layer, such as a silicon oxide layer.

According to the present disclosure, a high quality semiconductor device with a single crystal gate can be fabricated. The method according to the present disclosure can be used to manufacture transistors, memory devices, optical devices, etc.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a semiconductor device, the method comprising:

forming an insulating layer on a single crystal substrate;

etching the insulating layer in a predetermined pattern to expose the surface of the single crystal substrate;

depositing an amorphous material on the insulating layer and the exposed surface of the single crystal substrate;

completely melting the amorphous material on the single crystal substrate and the insulating layer using laser annealing and crystallizing the melted amorphous material to form a single crystal layer using the single crystal substrate as a seed; and patterning the single crystal layer to obtain a single crystal gate.

2. The method of claim 1, wherein the single crystal substrate is formed of a material selected from the group consisting of Si, GaAs, GaN, SiC, and SiGe.

3. The method of claim 1, wherein the insulating layer is formed of at least one material selected from Si-oxide (Si-O), Ga-oxide (Ga-O), Ge-oxide (Ge-O), SiGe-oxide (SiGe-O), and SiC-oxide (SiC-O).

4. The method of claim 1, wherein insulating layer is formed by thermally oxidizing the surface of the single crystal substrate.

5. The method of claim 4, wherein thermal oxidation is performed in a furnace in a wet condition at 700- 1100° C. for 1- 100 minutes.

6. The method of claim 1, wherein depositing of the amorphous material is performed using one of low-pressure chemical vapor deposition (LPCVD), sputtering, plasma enhanced chemical vapor deposition (PECVD), metal-organic chemical vapor deposition (MOCVD), electron-beam evaporation, and atom layer deposition (ALD).

7. The method of claim 6, wherein depositing of the amorphous material is performed using low-pressure chemical vapor deposition (LPCVD) at a temperature of 350- 750° C. for 1- 100 minutes.

8. The method of claim 1, wherein, in the process of completely melting the amorphous material, the laser annealing is performed at an energy density of 300- 1200 mJ/cm$^2$.

9. The method of claim 8, wherein, in the laser annealing, the number of laser shots is in a range of 1- 100 times.

10. The method of claim 8, wherein the laser annealing is performed using excimer laser.

11. The method of claim 1, wherein the patterning forms a single crystal gate that has substantially the same predetermined pattern as the insulating layer and is co-planar with the insulating layer.

12. The method of claim 1, further comprising forming a metal silicide layer on the single crystal gate.

13. The method of claim 12, further comprising forming a source electrode, a gate electrode, and a drain electrode on an interlayer metal dielectric (IMD) layer that is electrically connected to an underlying source, the single crystal gate, and a drain through contact holes formed in the IMD layer.

* * * * *